US009944822B2

(12) United States Patent
Jing et al.

(10) Patent No.: US 9,944,822 B2
(45) Date of Patent: Apr. 17, 2018

(54) COATING COMPOSITION AND METHOD OF MAKING AND USING THE SAME

(75) Inventors: Naiyong Jing, Woodbury, MN (US); Justin A. Riddle, St. Paul, MN (US); Zhigang Yu, Shanghai (CN); Mingna Xiong, Shanghai (CN); Zhengjun Wang, Shanghai (CN); Yiwen Chu, Shanghai (CN); Rui Pan, Hangzhou (CN); George Van Dyke Tiers, St. Paul, MN (US); Katherine A. Brown, Lake Elmo, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/876,296

(22) PCT Filed: Oct. 6, 2010

(86) PCT No.: PCT/CN2010/077572
§ 371 (c)(1),
(2), (4) Date: May 6, 2013

(87) PCT Pub. No.: WO2012/045204
PCT Pub. Date: Apr. 12, 2012

(65) Prior Publication Data
US 2013/0225760 A1  Aug. 29, 2013

(51) Int. Cl.
B05D 3/02 (2006.01)
C09D 175/04 (2006.01)
C03C 17/00 (2006.01)
C08K 3/36 (2006.01)
C09D 5/02 (2006.01)
C09D 7/12 (2006.01)
H01L 31/0236 (2006.01)
H01L 31/18 (2006.01)

(52) U.S. Cl.
CPC .......... *C09D 175/04* (2013.01); *C03C 17/008* (2013.01); *C08K 3/36* (2013.01); *C09D 5/028* (2013.01); *C09D 7/1266* (2013.01); *H01L 31/02366* (2013.01); *H01L 31/18* (2013.01); *C03C 2217/42* (2013.01); *C03C 2217/732* (2013.01); *C08K 2201/005* (2013.01); *Y02E 10/50* (2013.01)

(58) Field of Classification Search
CPC .... C09D 175/04; C09D 5/028; C09D 7/1266; H01L 31/18; H01L 31/02366; C03C 17/008; C03C 2217/42; C03C 2217/732; C08K 3/36; C08K 2201/732; C08K 2201/005; Y02E 10/50
USPC ..................................................... 427/385.5
See application file for complete search history.

(56) References Cited

U.S. PATENT DOCUMENTS

| | | |
|---|---|---|
| 3,976,497 A | 8/1976 | Clark |
| 5,128,181 A | 7/1992 | Kunert |
| 5,221,497 A | 6/1993 | Watanabe |
| 5,597,512 A | 1/1997 | Watanabe |
| 5,882,774 A | 3/1999 | Jonza |
| 5,939,471 A | 8/1999 | Watanabe |
| 5,976,678 A | 11/1999 | Kawazu |
| 6,088,163 A | 7/2000 | Gilbert |
| 6,479,146 B1 | 11/2002 | Caruso |
| 6,783,349 B2 | 8/2004 | Neavin |
| 7,128,944 B2 | 10/2006 | Becker |
| 7,153,588 B2 | 12/2006 | McMan |
| 7,604,866 B2 | 10/2009 | Ohashi |
| 8,046,960 B1 | 11/2011 | Kapany |
| 2001/0051213 A1 | 12/2001 | Schulz |
| 2002/0090519 A1 | 7/2002 | Kursawe |
| 2004/0028918 A1 | 2/2004 | Becker |
| 2004/0261836 A1 | 12/2004 | Kataoka |
| 2007/0251569 A1 | 11/2007 | Shan |
| 2008/0017237 A1 | 1/2008 | Bray |
| 2008/0087323 A1 | 4/2008 | Araki |
| 2008/0220152 A1* | 9/2008 | Sharma .......................... 427/74 |
| 2009/0014056 A1 | 1/2009 | Hockaday |
| 2009/0191389 A1 | 7/2009 | Guiheen |
| 2009/0233105 A1* | 9/2009 | Remington et al. .......... 428/432 |
| 2009/0283133 A1 | 11/2009 | Hebrink |
| 2009/0283144 A1 | 11/2009 | Hebrink |
| 2010/0009001 A1 | 1/2010 | Armes |
| 2010/0015433 A1* | 1/2010 | Arfsten et al. ................ 428/327 |
| 2010/0081747 A1 | 4/2010 | Nam |

(Continued)

FOREIGN PATENT DOCUMENTS

| | | |
|---|---|---|
| CN | 1809764 | 7/2006 |
| CN | 101309957 | 11/2008 |

(Continued)

OTHER PUBLICATIONS

Caruso et al. "Multilayered Titania, Silica, and Laponite Nanoparticle Coatings on Polystyrene Colloidal Templates and Resulting Inorganic Hollow Spheres" Chem. Mater. 2001, 13, 400-409.*
English Language Abstract for CN 1809764 dated Jul. 26, 2006.
English Language Abstract for CN 101309957 dated Nov. 19, 2008.
English Language Abstract for CN 101512387 dated Aug. 19, 2009.
English Language Abstract for JP 2004-319800 dated Nov. 11, 2004.
PCT International Search Report for PCT/US2011/054746 dated Apr. 20, 2012.
PCT International Search Report for PCT/US2011/054752 dated May 25, 2012.

(Continued)

Primary Examiner — Robert S Walters, Jr.
(74) Attorney, Agent, or Firm — Eric D. Levinson

(57) ABSTRACT

The present application is directed to a method of making an article. The method comprises coating a composition to a surface of a substrate. The coating composition comprises an aqueous continuous liquid phase, a silica nano-particle dispersed in the aqueous continuous liquid phase, and a polymer latex dispersion. The coated substrate is then heated to at least 300° C.

18 Claims, No Drawings

(56) References Cited

U.S. PATENT DOCUMENTS

| | | |
|---|---|---|
| 2010/0083953 A1 | 4/2010 | Lerner |
| 2010/0101621 A1 | 4/2010 | Xu |
| 2010/0177380 A1 | 7/2010 | Nagahama |
| 2010/0261809 A1 | 10/2010 | Nam |
| 2011/0033694 A1 | 2/2011 | Jing |
| 2011/0133138 A1 | 6/2011 | Kim |
| 2011/0186129 A1 | 8/2011 | Gombert |
| 2012/0058260 A1 | 3/2012 | Arsten |
| 2012/0276369 A1 | 11/2012 | Naiyong |
| 2013/0040126 A1 | 2/2013 | Pett |

FOREIGN PATENT DOCUMENTS

| | | |
|---|---|---|
| CN | 101512387 | 8/2009 |
| EP | 0823405 | 2/1998 |
| EP | 0823450 | 2/1998 |
| JP | 2004-319800 | 11/2004 |
| TW | I291902 | 1/2008 |
| WO | WO 2007/044295 | 4/2007 |
| WO | WO 2007/085320 A2 | 8/2007 |
| WO | WO 2007/093342 | 8/2007 |
| WO | WO 2008/028640 | 3/2008 |
| WO | WO 2009/106456 | 9/2009 |
| WO | WO 2009/140482 | 11/2009 |
| WO | WO 2010/012474 | 2/2010 |
| WO | WO 2010/078105 | 7/2010 |
| WO | WO 2010/104146 | 9/2010 |
| WO | WO 2010/114700 | 10/2010 |
| WO | WO 2012/047867 | 4/2012 |
| WO | WO 2012/047872 | 4/2012 |
| WO | WO 2012/047877 | 4/2012 |

OTHER PUBLICATIONS

PCT International Search Report for PCT/US2011/054740 dated Apr. 20, 2012.
PCT International Search Report for PCT/CN2010/077572 dated Jul. 14, 2011.
Caruso et al. 1999. *Langmuir*. 15:8276-81. "Preparation and characterization of ordered nanoparticle and polymer composite multilayers on colloids".
Supplemental European Search Report for EP 11 83 1440 dated Apr. 25, 2016.
Supplemental European Search Report for EP 11 83 1437 dated Apr. 25, 2016.

* cited by examiner

US 9,944,822 B2

COATING COMPOSITION AND METHOD OF MAKING AND USING THE SAME

TECHNICAL FIELD

The present disclosure broadly relates to compositions useful for coating a substrate, such as a glass panel.

BACKGROUND

There have been many efforts to develop compositions that can be applied to substrates to provide a beneficial protective layer with desirable properties such as one or more of easy cleaning, stain prevention, long lasting performance, antireflection, and the like. Many compositions developed for such applications rely on materials (for example, volatile organic solvents) that can present environmental issues and/or involve complex application processes. Further, problems relating to inadequate shelf-life continue to plague product developers of such compositions.

Accordingly, for many products a tradeoff of attributes is typically struck between the desired performance attributes, environmental friendliness of the materials, satisfactory shelf-life, and ease of use by a relatively unskilled user.

There remains a need for shelf-stable environmentally friendly compositions that can be coated on a substrate (for example, a glass panel) to provide long lasting protection from soil and stain accumulation and an antireflective surface, especially if they can be readily handled by a relatively unskilled user.

SUMMARY

The present application is directed to a method of making an article. The method comprises coating a composition to a surface of a substrate. The coating composition comprises an aqueous continuous liquid phase, a silica nano-particle dispersed in the aqueous continuous liquid phase, and a polymer latex dispersion. The coated substrate is then heated to at least 300° C.

In some embodiments, the silica nano-particle and the polymer latex dispersion form a core-shell particle.

The silica nano-particle is a nominally spherical particle, or an elongated particle, or a blend of nominally spherical and elongated silica nano-particles. In other embodiments the silica nano-particle is a chain of nominally spherical particles, a chain of elongated particles, or a chain of nominally spherical and elongated particles. There may also be a blend of chains and individual nano-particles.

In some embodiments, the substrate surface comprises a glass panel. The glass panel may have a flat surface or a structured surface. In some embodiments, the coated glass panel may be added to a photovoltaic cell to make a photovoltaic module.

Broad-band and low-cost inorganic antireflection (AR) coatings on substrates such as glass panels have been created. These coatings provide a significant increase in the transmission of glass panels, which, when used as the sun-facing surface of a photovoltaic module, translates into an increase in the sunlight received by photovoltaic cells in said photovoltaic module and an increase in the power output of the photovoltaic module. The AR coatings are wavelength independent across the entire visible region, thus showing no interference colors. These coatings exhibit dust release and dirt rinse-away by water properties, maintaining the transmission of light to the photovoltaic cell and the maintaining the power output of the photovoltaic module. Additionally, these coatings are aqueous based, and therefore environmentally friendly, and exhibit excellent weathering and environmental stability while providing improved coating uniformity.

The AR coatings of this application are made by applying aqueous dispersions of nano-particles which consist of spherical and/or non-spherical silica nano-particles combined with larger organic polymeric latex nano-particles. For the purpose of the present application, spherical includes nominally spherical particles. The resulting coatings are highly porous, especially after baking at elevated temperatures. Although highly porous, the single-layer AR coatings show excellent mechanical durability sufficient for commercial application. The nano-particles may be adhered to the larger organic polymeric latex particles, for example to form a core shell structured particle. The detailed preparation procedure and properties of these core-shell structured particles are disclosed in PCT Application US2010/027452.

In this application:

the term "polyurethane" includes any polymeric material that has at least one polyurethane segment;

the term "polyurethane segment" refers to at least two urethane and/or urea groups that are connected by an organic group.

DETAILED DESCRIPTION

Compositions according to the present disclosure comprise an aqueous continuous liquid phase, a silica nano-particle dispersed in the aqueous continuous liquid phase; and a polymer latex dispersed in the aqueous continuous liquid phase. In certain embodiments, the silica nano-particle and the polymer latex dispersion form a core-shell particle. The core shell may be observed using techniques such as transmission electron microscopy and electron fluorescence transmission electron microscopy.

As used herein, the term "shell" refers to an assembly of nonporous nominally spherical or non-spherical silica particles disposed on and covering (for example, densely covering) the surface of a polymer core. The nonporous spherical silica particles may optionally be covalently bonded one to another.

The aqueous continuous liquid phase comprises at least 50 percent by weight of water; for example, the aqueous continuous liquid phase may comprise at least 50, 60, 70, 80, or 90 percent by weight of water, or more. While the aqueous continuous liquid phase is preferably essentially free of (that is, contains less than 5 percent, for example less than 1 percent and in specific embodiments less than 0.1 percent by weight of based on the total weight of the aqueous continuous liquid phase) organic solvents, especially volatile organic solvents, organic solvents may optionally be included in a minor amount, such as 3 wt %, or 5 wt % and no more than 10 wt %, relative to the weight of the water of the aqueous phase, if desired. If present in the water of the aqueous phase, the organic solvents should preferably be water-miscible, or at least water-soluble in the amounts in which they are used, although this is not a requirement. Examples of organic solvents include acetone and lower molecular weight ethers and/or alcohols such as methanol, ethanol, isopropanol, n-propanol, glycerin, ethylene glycol, triethylene glycol, propylene glycol, ethylene or propylene glycol monomethyl or monoethyl ether, diethylene or dipropylene glycol methyl or ethyl ether, ethylene or propylene glycol dimethyl ether, and triethylene or tripropylene glycol monomethyl or monoethyl ether, n-butanol, isobutanol, s-butanol, t-butanol, and methyl acetate.

Optionally the composition may comprise reactive organic compounds such as epoxysilane, mercapto silane, tetraalkoxysilane and its oligomers, and the like, intended to strengthen the coatings upon heating and curing. The weight percentages are not included in the totals for organic solvents.

In order to minimize haze, the silica nano-particles have a volume average particle diameter (that is, a $D_{50}$) of 60 nanometers (nm) or less, for example 20 nanometers. Generally, the silica particles have a volume average particle diameter in a range of from 2 to 60 nm, for example in a range of from 1 to 20 nm, and in specific embodiments in a range of from 2 to 10 nm. The silica particles may have any particle size distribution consistent with the above 60 nm volume average particle diameter; for example, the particle size distribution may be monomodal, bimodal or polymodal.

In certain embodiments, the silica nano-particle is nonporous. In some embodiments, the silica nano-particle is nominally spherical, and in other embodiments, the silica nano-particle is an elongated particle. In some embodiments, there is a blend of spherical and elongated particles. Non-porous spherical silica particles in aqueous media (sols) are well known in the art and are available commercially; for example, as silica sols in water or aqueous alcohol solutions under the trade designations LUDOX from E. I. du Pont de Nemours and Co., Wilmington, Del.), NYACOL from Nyacol Co. of Ashland, Mass., or NALCO from Nalco Chemical Co. of Naperville, Ill. One useful silica sol with a volume average particle size of 5 nm, a pH of 10.5, and a nominal solids content of 15 percent by weight, is available as NALCO 2326 from Nalco Chemical Co. Other useful commercially available silica sols include those available as NALCO 1115 and NALCO 1130 from Nalco Chemical Co., as REMASOL SP30 from Remet Corp. of Utica, N.Y., and as LUDOX SM from E. I. du Pont de Nemours and Co.

The nonspherical colloidal silica particles may have a uniform thickness of 5 to 25 nm, a length, $D_1$ of 40 to 500 nm (as measured by dynamic light-scattering method) and a degree of elongation $D_1/D_2$ of 5 to 30, wherein $D_2$ means a diameter in nm calculated by the equation $D_2=2720/S$ and S means specific surface area in $m^2/g$ of the particle, as is disclosed in the specification of U.S. Pat. No. 5,221,497.

U.S. Pat. No. 5,221,497 discloses a method for producing acicular silica nano-particles by adding water-soluble calcium salt, magnesium salt or mixtures thereof to an aqueous colloidal solution of active silicic acid or acidic silica sol having a mean particle diameter of 3 to 30 nm in an amount of 0.15 to 1.00 wt. % based on CaO, MgO or both to silica, then adding an alkali metal hydroxide so that the molar ratio of $SiO_2/M_2O$ (M: alkali metal atom) becomes 20 to 300, and heating the obtained liquid at 60 to 300° C. for 0.5 to 40 hours. The colloidal silica particles obtained by this method are elongate-shaped silica particles that have elongations of a uniform thickness within the range of 5 to 40 nm extending in only one plane.

The nonspherical silica sol may also be prepared as described by Watanabe et al. in U.S. Pat. No. 5,597,512. Briefly stated, the method comprises: (a) mixing an aqueous solution containing a water-soluble calcium salt or magnesium salt or a mixture of said calcium salt and said magnesium salt with an aqueous colloidal liquid of an active silicic acid containing from 1 to 6% (w/w) of $SiO_2$ and having a pH in the range of from 2 to 5 in an amount of 1500 to 8500 ppm as a weight ratio of CaO or MgO or a mixture of CaO and MgO to $SiO_2$ of the active silicic acid; (b) mixing an alkali metal hydroxide or a water-soluble organic base or a water-soluble silicate of said alkali metal hydroxide or said water-soluble organic base with the aqueous solution obtained in step (a) in a molar ratio of $SiO_2/M_2O$ of from 20 to 200, where $SiO_2$ represents the total silica content derived from the active silicic acid and the silica content of the silicate and M represents an alkali metal atom or organic base molecule; and (c) heating at least a part of the mixture obtained in step (b) to 60° C. or higher to obtain a heel solution, and preparing a feed solution by using another part of the mixture obtained in step (b) or a mixture prepared separately in accordance with step (b), and adding said feed solution to said heel solution while vaporizing water from the mixture during the adding step until the concentration of $SiO_2$ is from 6 to 30% (w/w). The silica sol produced in step (c) typically has a pH of from 8.5 to 11.

Useful nonspherical silica particles may be obtained as an aqueous suspension under the trade name SNOWTEX-UP by Nissan Chemical Industries (Tokyo, Japan). The mixture consists of 20-21% (w/w) of acicular silica, less than 0.35% (w/w) of $Na_2O$, and water. The particles are about 9 to 15 nanometers in diameter and have lengths of 40 to 300 nanometers. The suspension has a viscosity of <100 mPas at 25° C., a pH of about 9 to 10.5, and a specific gravity of about 1.13 at 20° C.

Other useful acicular silica particles may be obtained as an aqueous suspension under the trade name SNOWTEX-PS-S and SNOWTEX-PS-M by Nissan Chemical Industries, having a morphology of a string of pearls. The mixture consists of 20-21% (w/w) of silica, less than 0.2% (w/w) of $Na_2O$, and water. The SNOWTEX-PS-M particles are about 18 to 25 nanometers in diameter and have lengths of 80 to 150 nanometers. The particle size is 80 to 150 by dynamic light scattering methods. The suspension has a viscosity of <100 mPas at 25° C., a pH of about 9 to 10.5, and a specific gravity of about 1.13 at 20° C. The SNOWTEX-PS-S has a particle diameter of 10-15 nm and a length of 80-120 nm.

Low- and non-aqueous silica sols (also called silica organosols) may also be used and are silica sol dispersions wherein the liquid phase is an organic solvent, or an aqueous organic solvent. In the practice of this invention, the silica sol is chosen so that its liquid phase is compatible with the intended coating composition, and is typically aqueous or organic solvent with a small amount of water. Ammonium stabilized acicular silica particles may generally be diluted and acidified in any order.

The polymer latex dispersion comprises any polymer that can be prepared as a latex, more typically as an alkaline pH stable latex. The term 'latex" does not imply a rubbery character. Exemplary polymers include acrylic polymers, styrenic polymers, vinyl acetate-ethylene copolymers, polyvinyl acetate, styrene-butadiene rubbers, polyurethanes (including urethane-acrylic polymers), polyesters, and polyamides. Preferably, the polymer is a film-forming polymer. The polymer may be thermosetting or thermoplastic. Preferably, the polymer comprises a polyurethane segment as in the case of a polyurethane or a urethane-acrylic polymer (which typically has polyurethane and polyacrylic segments). Suitable polymer latexes and methods for making them are widely known in the art, and many are commercially available.

Examples of commercially available polymer latexes include those aqueous aliphatic polyurethane and acrylic emulsions available as NEOREZ R-960, NEOREZ R-967, NEOREZ R-9036, and NEOREZ R-9699, NEOCRYL-A612, NEOCRYL-A6044 from DSM NeoResins, Inc. of Wilmington, Mass.; aqueous anionic polyurethane dispersions available as ESSENTIAL CC4520, ESSENTIAL CC4560, ESSENTIAL R4100, and ESSENTIAL R4188 from Essential Industries, Inc. of Merton, Wis.; polyester polyurethane dispersions available as SANCURE 843, SANCURE 898, and SANCURE 12929 from Lubrizol, Inc. of Cleveland, Ohio; an aqueous aliphatic self-crosslinking polyurethane dispersion available as TURBOSET 2025 from Lubrizol, Inc.; and an aqueous anionic, co-solvent free, aliphatic self-crosslinking polyurethane dispersion, available as BAYHYDROL PR240 from Bayer Material Science, LLC of Pittsburgh, Pa.

Combinations of polymers may be included in the polymer dispersion. For example, an individual polymer core may comprise two or more polymers. Further, the composition may contain two types of polymer cores, each comprising a different type of polymer, for example, as would be obtained by mixing an acrylic latex and a polyurethane latex. Typically, the particles in the polymer latexes are substantially spherical in shape. Typically, the polymer core comprises one or more water-insoluble polymers, although this is not a requirement.

Useful polymer particle sizes include those typical of latexes and other dispersions or emulsions. Typical polymer particle sizes are in a range of from about 0.01 micrometers to 100 micrometers, preferably in a range of from 0.01 to 0.2 micrometers, (10 to 200 nm), although this is not a requirement.

Core-shell particles may typically be prepared from an alkaline pH stable polymer particle dispersion and an alkaline spherical silica sol. Some alkaline polymer particle dispersions become unstable upon acidification to pH values of 5 or less. Accordingly, it is unexpected that adding the alkaline nonporous spherical silica sol to the aqueous polymer particle dispersion, upon acidification, results in core-shell particles that are stable at low pH values.

To achieve shell formation the nonporous spherical silica particles should typically be smaller than the polymer core, although this is not a requirement. For example, the volume average particle diameter (D50) of the polymer particles may be on the order of at least about 3 times greater than the volume average particle diameter (D50) of the spherical silica particles. More typically, the volume average particle diameter of the polymer particles should typically be on the order of at least 5 times, at least 10 times, or even at least 50 times greater than the volume average particle diameter of the spherical silica particles. For typical polymer particle sizes, a weight ratio of the nonporous spherical silica particles to the one or more polymer particles is in a range of from 30:70 to 97:3, preferably 80:20 to 95:5, and more preferably 85:15 to 95:5.

Without wishing to be bound by theory, it is believed that during gradual acidification of such a dispersion of polymer particles (for example, latex particles) and nonporous spherical silica particles in the aqueous liquid vehicle, the nonporous spherical silica particles deposit on the surface of the polymer latex particles, eventually in sufficient quantity to form a shell (typically at least a monolayer of the spherical silica particles) that serves to stabilize the dispersion and to reduce or prevent agglomeration and precipitation of the polymer particles. It is further believed that upon addition of base to raise the pH, the nonporous spherical silica particles dissociate from the polymer latex particles and regenerate a mixture of the two types of particles.

Each core-shell particle comprises a polymer core surrounded by a shell that consists essentially of nonporous spherical silica particles disposed on the polymer core.

In addition, coating compositions according to the present disclosure may be acidic, basic or neutral. In certain embodiments, the coating composition has a pH of less than 6, for example less than 4, and in specific embodiments less than 3. In other embodiments, the coating composition has a pH of between 7 and 13, for example between 8 and 11. To facilitate handling, the coating compositions preferably have a pH of at most 1, more preferably at most 2. In some embodiments, for example, those involving an acid sensitive substrate, it may be preferable to adjust the pH to a value of from about 5 to about 7.5, for example 6.

The compositions may be acidified to the desired pH level with an acid having a $pK_a$ of less than 5, preferably less than 2.5, and more preferably less than 1. Useful acids include both organic and inorganic acids such as, for example, oxalic acid, citric acid, benzoic acid, acetic acid, methoxyacetic acid, formic acid, propionic acid, benzenesulfonic acid, $H_2SO_3$, $H_3PO_4$, HCl, HBr, HI, $HBrO_3$, $HNO_3$, $HClO_4$, $H_2SO_4$, $CH_3SO_3H$, $CF_3SO_3H$, $CF_3CO_2H$, and $CH_3OSO_3H$. Preferred acids include HCl, $H_2SO_4$, and $H_3PO_4$. Combinations of organic and inorganic acids may also be used. Using weaker acids having a $pK_a$ of greater than 5 may not result in a uniform coating having the desirable properties such as transmissivity, cleanability and/or durability.

Compositions according to the present disclosure may optionally include at least one surfactant. The term "surfactant" as used herein describes molecules with hydrophilic (polar) and hydrophobic (non-polar) segments on the same molecule, and which are capable of reducing the surface tension of the composition. Examples of useful surfactants include: anionic surfactants such as sodium dodecylbenzenesulfonate, dioctyl ester of sodium sulfosuccinic acid, polyethoxylated alkyl (C12) ether sulfate, ammonium salt, and salts of aliphatic hydrogen sulfates; cationic surfactants such as alkyldimethylbenzylammonium chlorides and di-tallowdimethylammonium chloride; nonionic surfactants such as block copolymers of polyethylene glycol and polypropylene glycol, polyoxyethylene (7) lauryl ether, polyoxyethylene (9) lauryl ether, and polyoxyethylene (18) lauryl ether; and amphoteric surfactants such as N-coco-aminopropionic acid. Silicone surfactants and fluorochemical surfactants such as those available under the trade designation FLUORAD from 3M Company of St. Paul, Minn., may also be used. If present, the amount of surfactant typically is in an amount of less than about 0.1 percent by weight of the composition, preferably between about 0.003 and 0.05 percent by weight of the composition.

The composition may also optionally contain an antimicrobial agent. Many antimicrobial agents are commercially available. Examples include those available as: Kathon CG or LX available from Rohm and Haas Co. of Philadelphia, Pa.; 1,3-dimethylol-5,5-dimethylhydantoin; 2-phenoxyethanol; methyl-p-hydroxybenzoate; propyl-p-hydroxybenzoate; alkyldimethylbenzylammonium chloride; and benzisothiazolinone.

Compositions according to the present disclosure may be made by any suitable mixing technique. One useful technique includes combining an alkaline polymer latex with an alkaline spherical silica sol of appropriate particle size, and then adjusting the pH to the final desired level.

In some embodiments, the compositions are free of various impurities including nominally nonspherical silica particles, porous silica particles, and added crosslinkers (for example, polyaziridines or orthosilicates). Accordingly, some compositions according to the present disclosure may contain less than 0.1 weight percent or less than 0.01 weight percent of acicular silica particles, and, if desired, they may be free of acicular silica particles.

Compositions according to the present disclosure are useful, for example, for coating a substrate.

Suitable substrates may include, for example, glass and optical elements such as, for example, panels for photovoltaic modules, safety glass for motor vehicles, glass for window and architectural glazing, lenses and mirrors, ceramic (for example, ceramic tile), cement, stone, metal, and combinations thereof. Glass panels may be any glass composition that is used to produce tempered glass, including soda-lime silica glass and low-iron glass. Glass panels may have flat surfaces formed, for example by a float glass process, or they may have a surface structure that is textured, patterned or formed with a matte finish, as, for example, by roll processing. The term "heat resistant" refers to minimal temperature(s) required to provide a useful coating of this invention on the chosen substrate.

The substrates of the present application are especially useful in photovoltaic (PV) modules. In many photovoltaic module constructions, at least one photovoltaic cell is covered with a glass panel. The panel must allow transmission of sunlight in order to enable conversion of the full solar spectrum to electricity (power output). However, the reduction of light received by the PV cell is known to be as high as about 8% due to reflections at the glass-air interfaces when sunlight passes through a glass panel. Glass substrates also have a tendency to attract dirt, resulting in a further reduction in transmittance of the solar radiation. AR coatings of this application reduce reflections at a glass/air interface, and such antireflection and anti-soiling coatings on a PV module increase power output.

In some embodiments, compositions according to the present disclosure, when coated on a substrate and at least partially dried, provide improved cleanability by way of a reduced tendency to accumulate dirt and other contaminants. By "cleanable" it is meant that compositions according to the present disclosure, when dried and cured, provide a coating which is easier to clean by contacting with flowing water or a water spray to readily displace overlying contamination, thereby removing a substantial portion of the contamination from the coating. The water sheeting effect allows road spray, snow, slush dirt, and staining minerals in rainwater and in rinse water to substantially sheet out and run off the substrate surface, which significantly reduces the amount and the localized concentration of contaminants that are deposited after the water dries. Dust removal by air hosing and/or vacuum cleaning is facilitated by reduced attraction for particles.

In some embodiments, the composition provides an abrasion resistant layer that helps protect the substrate from damage from causes such as scratches, abrasion, and solvents.

The compositions are preferably coated on the article using conventional coating techniques, such as brush, bar, roll, wipe, curtain, rotogravure, spray, or dip coating techniques. Such application materials are preferably acid-resistant and may be hydrophilic or hydrophobic in nature, preferably hydrophilic. Coating techniques preferably result in a uniform coating of a controlled thickness. For example, coating thickness may be controlled in a dip coating process by various combinations of dip coating speeds and concentration and/or formulation of components in the coating composition. In another example, coating thickness may be controlled in a roll coating process by the selection of the roll, roll pressure, roll speed and concentration and/or formulation of components in the coating composition. In yet another example, coating thickness may be controlled in a rotogravure process by the selection of the gravure roll, roll speed and concentration and/or formulation of components in the coating composition. Preferably, the wet coating thickness is in the range of 0.5 to 50 micrometers, more preferably 1 to 20 micrometers. The wet coating thickness may be selected to optimize AR performance for a desired range of wavelengths, for example, the wavelength range over which a photovoltaic cell is most efficient. The coating composition generally contains between about 0.1 and 10 weight percent solids.

Dip coating studies related to coating thickness and % transmission were done with various dip coating speeds (30-50 mm/min), nano-particle concentrations (2.5-4.5%) and soak times (5-40 seconds). Soak times within these ranges had no effect on coating thickness. Coating thickness increased with increased dip speed within this range and the corresponding transmission increase shifted to longer wavelengths. Nano-particle concentration had a similar effect with increasing concentration causing increasing coating thickness and the corresponding transmission increase shifted to longer wavelengths.

The optimal average dry coating thickness is dependent upon the particular composition that is coated, but in general the average thickness of the dry composition coating thickness is between 0.05 to 5 micrometers, preferably 0.05 to 1 micrometer. In specific examples, the dry coating thickness was between about 0.1 and 0.25 micrometers.

Dry coating layer thicknesses may be higher, as high as a few microns or up to as much as 100 microns thick, depending on the application, such as for easy-clean of removal of undesired particulates, rather than antireflection. The mechanical properties may be expected to be improved when the coating thickness is increased.

For single layer coatings, it is known that in order to maximize light transmission in air through an optically transparent substrate, and minimize reflection by the substrate, the refractive index of the coating should equal as closely as possible the square root of the refractive index of the substrate and the thickness of the coating should be one-fourth (¼) of the optical wavelength of the incident light. The voids in the coating provide a multiplicity of subwavelength interstices between the silica particles where the index of refraction (RI) abruptly changes from that of air (RI=1) to that of the metal oxide particles (e.g., for silica RI=1.44). By adjusting the porosity, a coating having a calculated index of refraction very close to the square root of the refractive index of the substrate can be created. By utilizing coatings having optimal indices of refraction, at coating thicknesses equal to approximately one-fourth the optical wavelength of the incident light, the percent transmission of light through the coated substrate is maximized and reflection is minimized.

After coating the surface of the substrate, the resultant article is heated and optionally subjected to a toughening process that includes heating at an elevated temperature. The elevated temperature is generally at least 300° C., for example at least 400° C. In some embodiments, the heating process raises the temperature to a temperature equal to at least 500° C., at least 600° C., or at least 700° C. The temperature may be selected to cause the polymer latex from the dispersion to at least partially disappear, for example by thermal degradation. Generally, the substrate is heated for a time up to 30 minutes, up to 20 minutes, up to 10 minutes, or up to 5 minutes. The substrate surface may then be cooled rapidly, or variation of heating and cooling may be used to temper the substrate. For example, the optical element can be heated at a temperature in the range of 700° C. to 750° C. for about 2 to 5 minutes followed by rapid cooling.

The coating thickness after heating is in the range of 0.05 to 5 micrometer, preferably 90 to 350 nm, more preferably 100 to 250 nm. The coating thickness after heating may be selected to optimize AR performance for a desired range of wavelengths, for example, the wavelength range over which a photovoltaic cell is most efficient.

Preferably, compositions according to the present disclosure are stable when stored in the liquid form, for example, they do not gel, opacify, form precipitated or agglomerated particulates, or otherwise deteriorate significantly.

Objects and advantages of this disclosure are further illustrated by the following non-limiting examples, but the particular materials and amounts thereof recited in these examples, as well as other conditions and details, should not be construed to unduly limit this disclosure.

EXAMPLES

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

These abbreviations are used in the following examples: nm=nanometers, g=grams, min=minutes, hr=hour, mL=milliliter, hr=hour, sec=second, L=liter. All parts, percentages, or ratios specified in the examples are by weight, unless specified otherwise. If not otherwise indicated chemicals are available from Sigma-Aldrich, St. Louis, Mo.

Materials

Spherical silica nano-particle dispersions used are commercially available from the Nalco Company, Naperville, Ill. under the trade designations "NALCO 8699" (2-4 nm) "NALCO 1115 (4 nm), "NALCO 1050" (20 nm). Non-spherical silica nano-particles dispersions used are commercially available under the trade designations "SNOWTEX OUP" and "SNOWTEX UP" from Nissan Chemical Industries, Ltd. (Tokyo, Japan). These nonspherical nano-particle dispersions are 15-16 wt. % of acicular silica, less than 0.03% wt % $Na_2O$, and water. The particles are about 9 to 15 nm in diameter and have lengths of 40 to 100 nm. The suspensions have a viscosity of <20 mPas at 25° C., a pH of about 2-4, and a specific gravity of about 1.08-1.11 at 20° C.

3-(glycidoxypropyl)-trimethoxysilane commercially available under the trade designation "KH560" (97%), was obtained from Zhejiang Chem-Tech Group Co., Ltd. Hangzhou, Zhejiang Province, China, or from Dow Corning Company, Midland, Mich.

Polyurethane resins commercially available under the trade designations "NEOREZ R-960", "NEOREZ R961", "NEOREZ R9660" and acrylic resins commercially available under the trade designations "NEOCRYL A612" and "NEOCRYL A6044" were obtained from DSM Neoresins Co.

Alkyl polyglucoside surfactant commercially available under the trade designation "TRITON BG-10" was obtained from Dow Chemical, Midland, Mich. Linear alpha olefin sulfonate surfactant commercially available under the trade designation "POLYSTEP A-18" was obtained from Stepan Company (Northfield, Ill.).

Glass slides were obtained from Cardinal Glass (Eden Prarie, Minn.) and Primary low iron SOLITE glass (with smooth and rough sides) was obtained by CSG Holding Co. Ltd. (Shekou (Shenzhen), China)

Test Methods:

Glass Cleaning Procedure

Glass slides were obtained from Cardinal Glass (Eden Prarie, Minn.) and SOLITE was obtained by CSG Holding Co. Ltd. Their surfaces were cleaned with "ALCONOX" paste (Alconox, White Plains, N.Y.) by scrubbing with a paper towel and subsequently rinsed off with tap water and deionized water. The cleaned samples were then stored in deionized water ready for use.

Antireflection Coating Procedure

A clip with a freshly prepared glass slide was placed on a metal bar on a home-made dip coater (variable controlled screw-drive) or a KSV dip-coater (KSV Nima, Espoo, Finland). The slide was aligned so the sides were perpendicular to the lab bench top and the bottom was parallel to the lab bench top. The binder clips were secured with tape. The substrates were immersed in coating solutions and were gradually pulled out at an appropriate pulling speed. The coated samples were dried at room temperature for a few min and then heated at 120° C. for 5 min. Subsequently, the samples were subjected to elevated temperatures as indicated in the tables for 5 min and cooled to room temperature by air.

"SOLITE" glass was coated as with the glass slides above except that only one side was dipped (smooth side). The rough side was covered with a black adhesive tape. The taped glass was not allowed to sit in solution long or the tape would come off. After removing the tape residue was gently scrubbed away without getting the coating wet.

Transmission Measurements

Total transmittance measurements were made on a "HAZE-GARD DUAL" haze and transmittance meter (BYK-Gardner, Columbia, Md.). The % transmission was recorded or directly read from the instrument as the average of the solar daylight wavelength range (CIE D65 standard illuminant) according to ASTM D1003.

The light transmission spectrum from 400 to 1200 nm was obtained with a "LAMDA 900" spectrometer (Perkin Elmer, Waltham, Mass.)

Mechanical Durability Test

The mechanical durability was evaluated by a Wet Abrasion Scrub Tester (Sheen Instruments, Redhill, Surrey, England) using 1.4 kg weight pressure with a crock cloth.

Pencil Hardness Test

The pencil hardness test was carried out with a test method for film hardness coating (ASTM D 3363) using an "Elcometer 3080". Abrasion was stopped when a "failure" occurs for a specific pencil hardness—a scratch or haziness. If there was no scraping trace by scratching the coating with a pencil trace, the coating was given a "pass" or else it failed. The pass and failure were further examined by microscope to determine if the pencil traces resulted from scratching.

Comparative Example 1

"NALCO 8699" silica nano-particles (40 g, 15 wt %) and deionized water (80 g) were stirred together in a glass jar for 15 min. Concentrated $H_3PO_4$ was dropped into the dispersion to adjust the pH value to 2.0. 2.12 g 3-(glycidoxypropyl)-trimethoxysilane ("KH560") was slowly added to the solution. Then the solution was heated to 60° C. and kept for 10 hrs. Coating solution concentrations were about 5 wt % and were used in the preparation of coating solutions. The modified "NALCO 8699" silica nano-particle dispersion solution (5.0 wt %, 75 mL) was diluted to 2.5 wt % with 75 mL deionized water, and subsequently mixed with "SNOW-TEX OUP" dispersion (2.5 wt %, 150 mL, pH=2.5 pre-acidified with $H_3PO_4$) in a 1:1 ratio. "TRITON BG-10" surfactant (75 mg) was added to the final particle solutions. See Table 2 for % T.

Examples 1-44 in Table 1 and Examples in Tables 2-5: Preparation of Polyurethane/Silica and Acrylic/Silica Coating Solutions Polyurethane "NEOREZ R-960", "NEOREZ 8961" and "NEOREZ R9660" latex dispersions were diluted with deionized water to 2.5 wt %, 3.0 wt %, 3.2 wt %, 4.0 wt % and 5 wt % individually. Nalco silica nano-particle dispersions "NALCO 8699" (2 nm-4 nm, 16.5%), "NALCO 1115" (4 nm, 16.5 wt %), "NALCO 1050" (22 nm, 50 wt %) and Nissan acicular nano-particle dispersions "SNOWTEX OUP" (15 wt %) and "SNOWTEX UP (15 wt %) were diluted to 2.5 wt % 3.0 wt %, 3.2 wt %, 4.0 wt % and 5 wt % with deionized water individually. The diluted polyurethane or acrylic dispersions were mixed with "NALCO 8699" (2 nm-4 nm, 16.5%), "NALCO 1115" (4 nm, 16.5 wt %), "NALCO 1050" (22 nm, 50 wt %) and Nissan nano-particle dispersions, "SNOWTEX OUP" and "SNOWTEX UP" respectively in ratios as described in the Tables. The resulting mixed dispersions were clear and their solutions were basic with pH values of 10-11. The mixed solutions were subsequently subjected to acid titration with 1N HCl, aqueous $HNO_3$ or other aqueous inorganic acids to the desired pH values. The mixed dispersion solutions became slightly cloudy when the solution became acidic.

TABLE 1

Antireflection Coatings Dried at 750° C. and Transmission Values

| Example | Composition | Solution concentration (wt %) | pH | Transmission at 550 nm | Average transmission over 400-800 nm |
|---|---|---|---|---|---|
| "SOLITE" glass with no coating | N/A | N/A | N/A | 91.44 | 91.49 |
| 1 | "NALCO 8699":"SNOWTEX OUP:"NEOREZ R960" 45:45:10 | 2.5 | 2.5 | 94.98 | 94.76 |
| 2 | "NALCO 8699":"SNOWTEX OUP:"NEOREZ R960" 45:45:10 | 3.0 | 2.5 | 94.97 | 94.98 |
| 3 | "NALCO 8699":"SNOWTEX OUP:"NEOREZ R960" 45:45:10 | 3.2 | 10.5 | 93.64 | 93.52 |
| 4 | "NALCO 8699":"SNOWTEX OUP:"NEOREZ R960" 45:45:10 | 5.0 | 10.5 | 94.45 | 94.70 |
| 5 | "NALCO 8699":"SNOWTEX OUP:"NEOREZ R960" 45:45:10 | 4.0 | 2.5 | 94.42 | 94.03 |
| 6 | "NALCO 1115":"SNOWTEX OUP:"NEOREZ R960" 45:45:10 | 2.5 | 2.5 | 94.21 | 94.00 |
| 7 | "NALCO 1115":vSNOWTEX OUP:"NEOREZ R960" 45:45:10 | 3.0 | 2.5 | 95.07 | 94.85 |
| 8 | "NALCO 1115":"SNOWTEX OUP:"NEOREZ R960" 45:45:10 | 3.2 | 2.5 | 94.37 | 94.28 |
| 9 | "NALCO 1115":"SNOWTEX OUP:"NEOREZ R960" 45:45:10 | 3.5 | 2.5 | 94.56 | 94.46 |
| 10 | "NALCO 8699":"NEOREZ R961" 90:10 | 2.5 | 2.5 | 95.02 | 94.84 |
| 11 | "NALCO 8699":"NEOREZ R961" 90:10 | 3.2 | 2.5 | 95.51 | 95.25 |
| 12 | "NALCO 8699":"SNOWTEX OUP":"NEOREZ R960" 42.5:42.5:15 | 3.2 | 2.5 | 93.61 | 93.81 |
| 13 | "NALCO 8699":"SNOWTEX OUP":"NEOREZ R960" 40:40:20 | 3.2 | 2.5 | 93.32 | 93.41 |

TABLE 1-continued

Antireflection Coatings Dried at 750° C. and Transmission Values

| Example | Composition | Solution concentration (wt %) | pH | Transmission at 550 nm | Average transmission over 400-800 nm |
|---|---|---|---|---|---|
| 14 | "NALCO 8699":"SNOWTEX OUP:"NEOREZ R961" 45:45:10 | 3.2 | 2.5 | 94.91 | 95.11 |
| 15 | "NALCO 8699":"SNOWTEX OUP:"NEOREZ R961" 42.5:42.5:15 | 3.2 | 2.5 | 93.80 | 93.95 |
| 16 | "NALCO 8699":"SNOWTEX OUP:"NEOREZ R961" 40:40:20 | 3.2 | 2.5 | 93.0 | 93.10 |
| 17 | "NALCO 8699":"SNOWTEX OUP:"NEOREZ R960" 42.5:42.5:15 | 2.5 | 2.5 | 94.55 | 94.62 |
| 19 | "NALCO 8699":"SNOWTEX OUP:"NEOREZ R961" 42.5:42.5:15 | 2.5 | 2.5 | 93.41 | 93.52 |
| 20 | "NALCO 8699":"SNOWTEX OUP:"NEOREZ R961" 40:40:20 | 2.5 | 2.5 | 92.86 | 92.90 |
| 21 | "NALCO 8699":"SNOWTEX OUP:"NEOREZ R960" 47.5:47.5:5 | 3.2 | 2.5 | 94.66 | 94.49 |
| 22 | "NALCO 8699":"SNOWTEX OUP:"NEOREZ R960"46.25:46.25:7.5 | 3.2 | 2.5 | 95.38 | 95.10 |
| 23 | "NALCO 8699":"SNOWTEX OUP:"NEOREZ R961" 47.5:47.5:5 | 2.5 | 2.5 | 94.50 | 94.48 |
| 24 | "NALCO 8699":"SNOWTEX OUP:"NEOREZ R961"46.25:46.25:7.5 | 3.2 | 2.5 | 95.16 | 94.88 |
| 25 | "NALCO 8699":"SNOWTEX OUP:"NEOREZ R960" 45:45:10 | 3.2 | 2.5 | 93.66 | 93.57 |
| 27 | "NALCO 1115":"NEOREZ R961" 90:10 | 3.2 | 2.5 | 93.71 | 93.62 |
| 29 | "NALCO 8699":"NEOREZ R960" 90:10 | 3.2 | 2.5 | 94.25 | 94.31 |
| 30 | "NALCO 8699":"SNOWTEX OUP:"NEOREZ R961" 45:45:10 | 2.5 | 2.5 | 95.55 | 95.15 |
| 31 | 8699:Snowtex- oup:R9660 45:45:10 | 2.5 | 2.5 | 95.08 | 94.88 |
| 31 | "NALCO 8699":"NEOREZ R960" 45:45:.10 | 3.2 | 2.5 | 95.25 | 94.96 |
| 32 | "NALCO 8699":"NEOREZ R960" 63:27:10 | 3.2 | 2.5 | 95.41 | 95.20 |
| 34 | "NALCO 8699":"NEOREZ R960" 27:63:10 | 3.2 | 2.5 | 94.67 | 94.87 |
| 35 | "NALCO 1115":"NEOREZ R960" 80:20 | 3.0 | 2.5 | 94.65 | 94.45 |
| 36 | "NALCO 1115":"NEOREZ R960" 80:20 | 3.2 | 2.5 | 95.09 | 94.88 |
| 37 | "NALCO1115":"NEOREZ R960" 80:20 | 3.5 | 2.5 | 95.27 | 95.01 |
| 38 | "NALCO 1115":"NEOREZ R960" 90:10 | 3.2 | 2.5 | 94.21 | 94.00 |
| 39 | "NALCO 1115":"NEOREZ R960" 85:15 | 3.2 | 2.5 | 95.09 | 94.84 |
| 40 | "NALCO 1115":"NALCO 1050":"NEOREZ R960" 63:27:10 | 2.5 | 2.5 | 94.10 | 93.95 |
| 41 | "NALCO 1115":"NEOCRYL A612" 90:10 | 3.0 | 2.5 | 94.66 | 94.46 |
| 42 | "NALCO 1115":"SNOWTEX OUP:"NEOCRYL A612" 45:45:10 | 3.0 | 2.5 | 94.53 | 94.36 |
| 43 | "NALCO 8699":"SNOWTEX OUP:"NEOCRYL A6044" 40:40:20 | 5.0 | 10.5 | 94.79 | 94.22 |
| 44* | "NALCO1115"/"SNOWTEX OUP"/"NEOREZ R960" | 2.5 | 2.5 | 94.76 | 93.61 |

NOTES:
All the dispersion solutions contain 1 wt % of "POLYSTEP A-18" surfactant leveling agent, based on the solid content of the core-shell nano-particles. "POLYSTEP A-18" was added to the solutions prior to acidification. Dip Coating speed was 38 mm/min, soaking time was 20 sec. Coated samples were heated at 120° C. for 5 min and subsequently baked at 750° C. for 5 min *EXCEPT example 44 which was heated to 400° C. for 5 min. "SOLITE" glass was used for all testing

TABLE 2

Effect of Polymer Latex on Coatings and Transmission Values

| Example | Solution concentration (wt %) | Average increase in transmittance from 400-800 nm after drying at 120° C. | Average increase in transmittance from 400-800 nm after baking at 700° C. for 5 min. |
|---|---|---|---|
| Comparative 1 | 2.5 | 2.60% | 2.90% |
| Example 1 (with polymer latex) | 2.5 | 3.60% | 3.40% |

NOTES:

Dip Coating speed was 38 mm/min, soaking time was 20 sec. "SOLITE" glass was used for all testing. Coatings dried at 120° C. for 5 min and then subsequently heated at 750° C. for 5 min.

TABLE 3

Hardness and Transmission Values of Acrylic/Silica and Polyurethane/Silica

| Composition | Dip Speed (cm/min) | Average transmission of 500 nm-900 nm | Average transmission of 500 nm-900 nm after Linear Abrasion test | Pencil Hardness |
|---|---|---|---|---|
| "NALCO 1115"/"NEOCRYL A612" 90:10 (3.0 wt %) | 45 | 94.66 | 93.96 | 3H |
| "NALCO 1115"/"NEOREZ R960" 90:10 (2.4 wt %) | 50 | 95.20 | 94.60 | 3H |

NOTES:

Linear Abrasion data after 20 cycles with Crock cloth at 30 cycles/mm and 1400 g. The solutions do not contain "POLYSTEP A-18". Coated samples were heated at 120° C. for 5 min and subsequently baked at 700° C. for 5 min. "SOLITE" glass was used for all testing.

TABLE 4

Epoxysilane additive

| Composition | Epoxy silane additive | Average transmission over 500-900 nm | Average transmission of 500-900 nm after Linear Abrasion Test | Mechanical Durability |
|---|---|---|---|---|
| "NALCO 8699": "SNOWTEX OUP:"NEOREZ R960" 45:45:10 (3.2 wt %) | N/A | 95.06 | 94.46 | Slightly scratched after 50 cycles |
| "NALCO 8699": "SNOWTEX OUP:"NEOREZ R960" 45:45:10 (3.0 wt %) | "KH560" (5 wt %) | 95.03 | 94.60 | No scratch after 50 cycles |

NOTES:

The above experiments were conducted according to EX1 but in addition "KH560" in ethanol (10 wt %) was added to the solution. The solutions contain 1% "POLYSTEP A-18". Mechanical durability evaluated using a paper towel and hand rubbing for 50 cycles.

TABLE 5

Effect of Heating Temperature on Coated Samples

| Formulation | Ratio | Dip Speed | Heating Temp (° C.) of coated sample | Peak ΔT and nm | ΔT at 550 nm | Avg ΔT over 500-900 nm |
|---|---|---|---|---|---|---|
| "NALCO 1115"/"NEOREZ R960" | (9:1) | 45 | 700 | 7.98, 597 | 7.44 | 7.13 |
| "NALCO 1115"/"NEOREZ R960" | (9:1) | 45 | 250 | 5.87, 756 | 5.75 | 5.09 |
| "NALCO 1115"/"NEOREZ R960" | (9:1) | 40 | 250 | 6.81, 656 | 6.11 | 5.60 |
| "NALCO 1115"/"NEOREZ R960" | (17:3) | 45 | 700 | 7.81, 688 | 7.77 | 7.18 |
| "NALCO 1115"/"NEOREZ R960" | (17:3) | 45 | 250 | 4.47, 853 | 3.29 | 2.65 |

TABLE 5-continued

Effect of Heating Temperature on Coated Samples

| Formulation | Ratio | Dip Speed | Heating Temp (° C.) of coated sample | Peak ΔT and nm | ΔT at 550 nm | Avg ΔT over 500-900 nm |
|---|---|---|---|---|---|---|
| "NALCO 1115"/"NEOREZ R960" | (17:3) | 40 | 250 | 6.29, 732 | 6.24 | 5.59 |
| "NALCO 1115"/"NEOREZ R960" | (8:2) | 44 | 700 | 7.28, 899 | 4.37 | 3.76 |
| "NALCO 1115"/"NEOREZ R960" | (8:2) | 40 | 700 | 7.65, 855 | 6.50 | 5.76 |
| "NALCO 1115"/"NEOREZ R960" | (8:2) | 35 | 700 | 7.50, 893 | 5.98 | 5.31 |
| "NALCO 1115"/"NEOREZ R960" | (8:2) | 32 | 700 | 8.00, 678 | 7.95 | 7.36 |
| "NALCO 1115"/"NEOREZ R960" | (8:2) | 30 | 250 | 2.24, 674 | 2.19 | 1.91 |
| "NALCO 1115"/"NEOREZ R960"/"POLYSTEP A18" | (9:1:1%) | 40 | 250 | 4.91, 671 | 4.55 | 3.97 |
| "NALCO 1115"/"NEOREZ R960"/"POLYSTEP A18" | (9:1:1%) | 45 | 700 | 6.46, 578 | 5.21 | 4.83 |
| "NALCO 1115"/"NEOREZ R960"/"POLYSTEP A18" | (9:1:1%) | 50 | 700 | 7.31, 691 | 7.29 | 6.70 |
| "NALCO 1115"/"NEOREZ R960"/"POLYSTEP A18" | (8.5:1.5:1%) | 35 | 250 | 2.43, 567 | 1.55 | 1.23 |
| "NALCO 1115"/"NEOREZ R960"/"POLYSTEP A18" | (8.5:1.5:1%) | 40 | 250 | 5.87, 766 | 5.74 | 5.00 |
| "NALCO 1115"/"NEOREZ R960"/"POLYSTEP A18" | (8.5:1.5:1%) | 45 | 700 | 7.57, 669 | 7.55 | 7.03 |
| "NALCO 1115"/"NEOREZ R960"/"POLYSTEP A18" | (8.5:1.5:1%) | 50 | 700 | 6.76, 601 | 6.18 | 5.58 |
| "NALCO 1115"/"NEOREZ R960"/"POLYSTEP A18" | (8:2:1%) | 30 | 250 | −1.94, 717 | −1.95 | −2.87 |
| "NALCO 1115"/"NEOREZ R960"/"POLYSTEP A18" | (8:2:1%) | 32 | 700 | 8.29, 627 | 8.03 | 7.53 |

NOTES:
"POLYSTEP A-18" (1% based on total solids) and glass slides coated on both sides were used in all samples.
Concentration was 3.0 wt. % in all samples.

Various modifications and alterations of this disclosure may be made by those skilled in the art without departing from the scope and spirit of this disclosure, and it should be understood that this disclosure is not to be unduly limited to the illustrative embodiments set forth herein.

What is claimed is:

1. A method of making an article, the method comprising providing an aqueous silica nano-particle composition, providing an alkaline pH stable polymer latex dispersion; mixing the aqueous silica nano-particle composition with the polymer latex dispersion to create a mixture comprising an aqueous continuous liquid phase comprising at least 50% by weight of water,
adjusting the pH of the mixture to less than 6 to form core-shell particles and create a coating composition,
coating the surface of a substrate with the coating composition;
heating the coated substrate to at least 300° C.,
wherein the coating composition has a pH of less than 6,
wherein the coating composition is capable of regenerating the polymer latex dispersion and the silica nano-particle composition upon raising the pH of the coating composition, and wherein the coating on the substrate is antireflecting after the heating step.

2. The method of claim 1 wherein the silica nano-particle is a nominally spherical particle.

3. The method of claim 1 wherein the silica nano-particle is an elongated particle.

4. The method of claim 1 wherein the silica nano-particle composition comprises a blend of nominally spherical and elongated silica nano-particles.

5. The method of claim 1 wherein the silica nano-particle is a chain of nominally spherical particles.

6. The method of claim 1 wherein the silica nano-particle is a chain of elongated particles.

7. The method of claim 1 wherein the silica nano-particle is a chain of nominally spherical and elongated particles.

8. The method of claim 1 wherein each core-shell particle comprises a polymer core surrounded by a shell consisting essentially of nonporous nominally spherical silica particles disposed on the polymer core, wherein the nonporous nominally spherical silica particles have a volume average particle diameter of 60 nanometers or less.

9. The method of claim 8 wherein the volume average particle diameter is 20 nanometers or less.

10. The method of claim 1, wherein the substrate surface comprises a glass panel.

11. The method of claim 10 wherein the glass panel has a flat surface.

12. The method of claim 10 wherein the glass panel has a structured surface.

13. The method of claim 10 comprising adding the coated glass panel to a photovoltaic cell to make a photovoltaic module.

14. The method of claim 1 wherein the coated substrate is heated to at least 400° C.

15. The method of claim 1 wherein the coated substrate is heated to at least 500° C.

16. The method of claim 1 wherein the coated substrate is heated to at least 600° C.

17. The method of claim 1 wherein the coated substrate is heated to at least 700° C.

18. The method of claim 1 wherein the silica nano-particle is nonporous.

* * * * *